United States Patent [19]

Yama

[11] Patent Number: 5,150,180
[45] Date of Patent: Sep. 22, 1992

[54] PACKAGED SEMICONDUCTOR DEVICE WITH HIGH ENERGY RADIATION ABSORBENT GLASS

[75] Inventor: Yomiyuki Yama, Itami, Japan

[73] Assignee: Mitsubishi Denki Kabushiki Kaisha, Japan

[21] Appl. No.: 690,279

[22] Filed: Apr. 24, 1991

[30] Foreign Application Priority Data

Jun. 15, 1990 [JP] Japan .................... 2-158421

[51] Int. Cl.$^5$ ............... H01L 31/00; H01L 27/14
[52] U.S. Cl. .................................. 357/29; 357/74; 357/84; 250/370.01; 250/370.14
[58] Field of Search .............. 357/29, 84, 74; 250/370.01, 370.14

[56] References Cited

FOREIGN PATENT DOCUMENTS

| | | |
|---|---|---|
| 57-39557 | 3/1982 | Japan ................... 357/84 |
| 60-251648 | 12/1985 | Japan . |
| 62-146082 | 6/1987 | Japan . |
| 64-28952 | 1/1989 | Japan ................... 357/84 |
| 1-17257 | 3/1989 | Japan . |
| 1-300547 | 12/1989 | Japan . |

Primary Examiner—Jerome Jackson, Jr.
Attorney, Agent, or Firm—Leydig, Voit & Mayer

[57] ABSTRACT

A packaged semiconductor device includes a semiconductor element for receiving light, a semiconductor package containing the semiconductor element and including leads, optical glass sealing the semiconductor package and protecting the semiconductor element, the optical glass transmitting light and including an element that absorbs high energy radiation. Therefore, radiation such as gamma rays is absorbed by the anti-radiation glass and deterioration of the internal semiconductor element is prevented. A metal frame including a heavy metal radiation shield is provided at the periphery of the antiradiation glass. Thus, scattering of light in the semiconductor package is prevented and the positional deviation of the anti-radiation glass in the semiconductor package is prevented.

8 Claims, 8 Drawing Sheets

F I G. 7
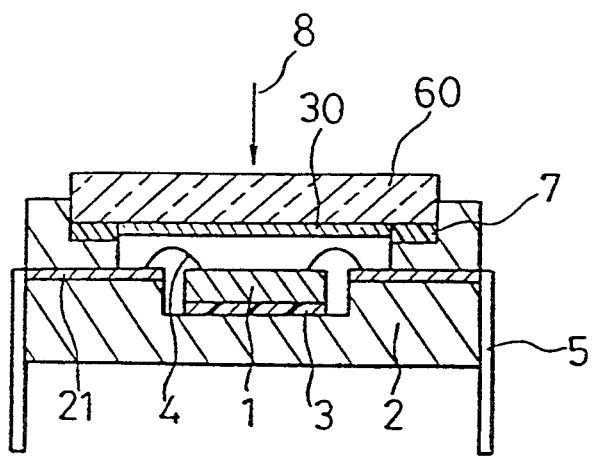
F I G. 8
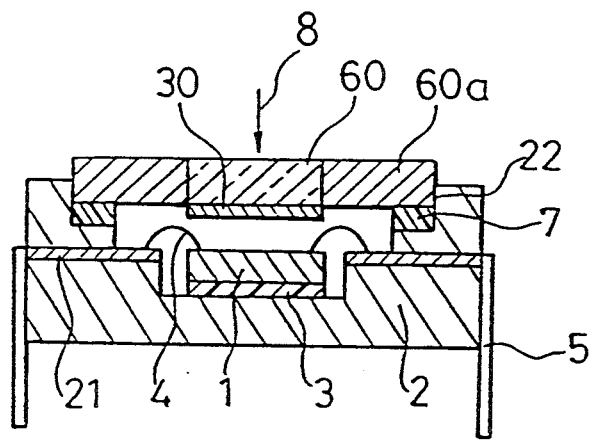

PACKAGED SEMICONDUCTOR DEVICE WITH HIGH ENERGY RADIATION ABSORBENT GLASS

FIELD OF THE INVENTION

The present invention relates to a packaged semiconductor device and more particularly to a packaged semiconductor element on which light is incident from the surface such as a CCD or CSD, or solid-state sensor or EEPROM and which is appropriate for use in an environment where high energy radiation exists such as in the space environment or a nuclear reactor environment.

BACKGROUND OF THE INVENTION

FIG. 10 is a cross-sectional view showing a conventional semiconductor package for packaging a solid-state imaging element in a solid-state imager. In FIG. 10, reference numeral 1 designates a solid state imaging element and reference numeral 2 designates a semiconductor package containing the solid-state imaging element 1. An internal wiring 21 of the semiconductor package 2 is provided on the surface of the package 2. Die-bonding resin 3 is used for fixing the solid-state imaging element 1 to the semiconductor package 2. Metal wires 4 are provided for electrically connecting the solid-state imaging element 1. External leads 5 provided at the side faces of the package 2 for electrically connecting the solid-state imaging element 1. Non-alkali glass 6 is provided for protecting the solid-state imaging element 1 and the metal wires 4 from the external atmosphere. Numeral 7 designates a sealing resin for fixing the non-alkali glass 6 to the semiconductor package 2. Numeral 8 designates radiation such as gamma rays.

A description is given of the structure of the semiconductor package of FIG. 10 hereinafter.

The solid-state imaging element 1 is fixed to the semiconductor package 2 by die-bonding resin 3 such as epoxy resin. Further, the internal wiring 21 and the pad of the solid-state imaging element 1 are connected by the metal wires 4 and thus the electric signals from the solid-state imaging element 1 are transferred outside of the package 2 by the external leads 5.

Further, in order to protect the solid-state imaging element 1 from the external atmosphere, including radiation such as gamma rays 8, non-alkali glass 6 is fixed to the semiconductor package 2 using sealing resin 7.

The incident light 8 incident from above the non-alkali glass 6, passes therethrough and is received by the receiving surface of the solid-state imaging element 1 and then an electrical signal from the solid-state imaging element 1 is taken to the outside through the external leads 5.

FIG. 11 shows an optical characteristics of the non-alkali glass where radiation such as gamma rays 8 irradiated to the solid-state imaging element 1 packaged as shown in FIG. 10. As shown in the FIG. 11, although the non-alkali glass 6 has transmissivity of about 100% for light of wavelength 400 nm before the irradiation by gamma rays (shown as "Pre-Rad" in FIG. 11), as the irradiation amount of gamma rays becomes $4 \times 10^4$ rads, $3 \times 10^5$ rads, and $1 \times 10^6$ rads, the transmissivity of the non-alkali glass is gradually reduced. This is because the color of the non-alkali glass changes and becomes non-transparent due to irradiation by gamma rays.

The conventional semiconductor package for a solid-state imager is constructed as described above, and when it is in a space environment, especially mounted on an artificial satellite or used in observations for a nuclear reactor, it is directly exposed to radiation such as gamma rays, and the non-alkali glass is deteriorated.

Furthermore, this radiation generates holes that are trapped in the gate oxide film of the n channel transistor constituting the solid-state imaging element 1 and the threshold voltage therefore varies.

White circles in FIG. 4 show the change of the threshold voltage of the transistor of the solid-state imaging element 1 due to irradiation by gamma rays where quartz is used for the non-alkali glass 6. As shown in FIG. 4, the threshold voltage which is 0.4 V before the irradiation, becomes about $-0.8$ V after the irradiation by gamma rays of $10^6$ rads. Such a large change in threshold voltage deteriorates the transistor characteristics and deteriorates the reliability of the solid-state imager.

Furthermore, because the non-alkali glass 6 is only fixed to the upper surface of the semiconductor package itself 2 by sealing resin 7, it may get out of position with respect to package 2 and cause leakage of air into the package.

SUMMARY OF THE INVENTION

The present invention is directed to solving the above-described problems and has for its object to provide a semiconductor package that is not affected by radiation such as gamma rays and that protects the semiconductor device such as a solid-state imaging element from deterioration.

Another object of the present invention is to provide a semiconductor package that can prevent positional deviation of the glass with respect to the package.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with the present invention, in a semiconductor package, optical glass for protecting a semiconductor element such as a solid-state imaging element on which light is incident includes an anti-radiation glass comprising a material including an element which absorbs radiation. Therefore radiation such as gamma rays is absorbed by the anti-radiation glass and the deterioration of the packaged semiconductor element is prevented.

In accordance with another aspect of the present invention, a metal frame including a heavy metal radiation shield is provided at the periphery of the anti-radiation glass. Therefore, the scattering of light in the semiconductor package is prevented and the positional deviation of the anti-radiation glass against the semiconductor package is prevented.

BRIEF DESCRIPTION OF THE DRAWINGS

FIG. 7 and 8 are cross-sectional views of semiconductor packages in accordance with fourth and fifth embodiments of the present invention;

DETAILED DESCRIPTION OF THE PREFERRED EMBODIMENTS

An embodiment of the present invention will be described in detail with reference to the drawings.

Figure 1:
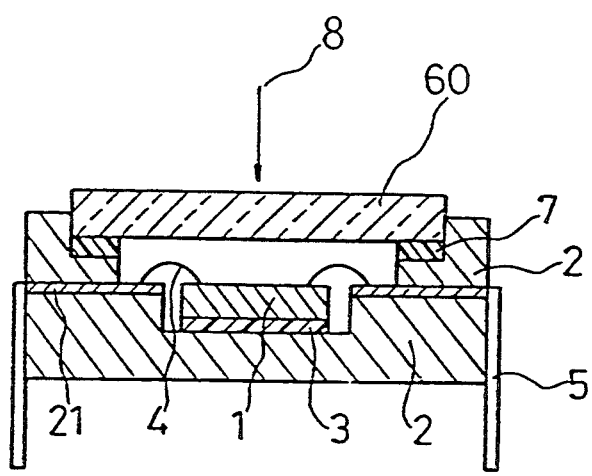
FIG. 1 is a cross-sectional view showing a semiconductor package in accordance with a first embodiment of the present invention.

FIG. 1 shows a semiconductor package in accordance with a first embodiment of the present invention. Numeral 1 designates a solid-state imaging element. A semiconductor package 2 is provided for packaging the solid-state imaging element 1. Internal wiring 21 of the semiconductor package 2 is provided on the surface of the package 2. Die-bonding resin 3 is used for fixing the solid-state imaging element 1 to the semiconductor package 2. Metal wires 4 are provided for electrically connecting the solid-state imaging element 1. External leads 5 are provided at the side face of the package 2 for transferring electrical signals from the solid-state imaging element 1 to the outside. Numeral 60 designates anti-radiation glass including cerium oxide or titanium oxide for protecting the solid-state imaging element 1 and metal wires 4 from the external atmosphere. Numeral 7 designates sealing resin for fixing the anti-radiation glass 60 to the semiconductor package 2. Numeral 8 designate radiation such as gamma rays.

FIGS. 2(a)–2(d) show the production process of the semiconductor package in the present invention. The production process will be described with reference to FIGS. 2(a) to 2(d).

Figure 2A:
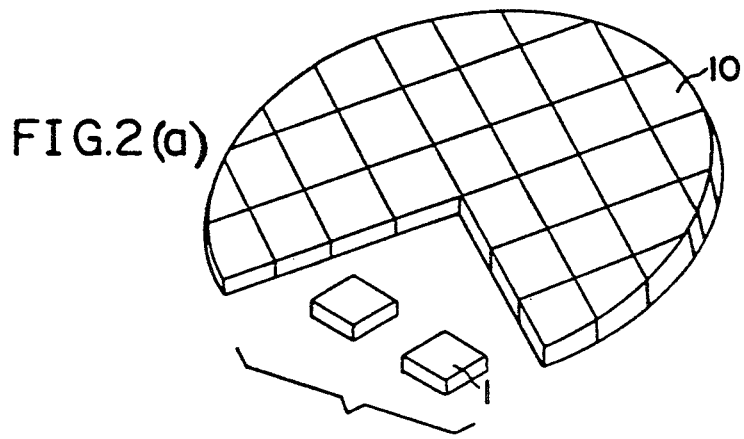
FIGS. 2(a)-2(d) are diagrams showing a production process flow for producing the semiconductor package of FIG. 1.

As shown in FIG. 2(a), solid-state imaging elements 1 having an area of 10 mm² are separated one by one from the wafer 10 on which they are produced.

Figure 2B:
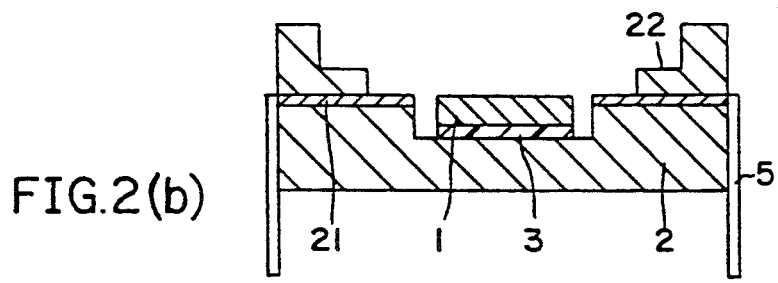

Thereafter, layers comprising such as aluminum oxide are successively laminated and internal wiring 21 is placed therebetween and the product is baked to produce a semiconductor package 2. Thereafter, as shown in FIG. 2(b), the external leads 5 comprising FeNiCo alloy or FeNi alloy are fixed to the side faces of the semiconductor package 2 by Ag solder, and the external leads 5 and the internal wiring 21 are connected. Then, the solid-state imaging element 1 is fixed to the semiconductor package 2 using a die-bonding resin 3 containing a conductive epoxy resin which is hardened at a temperature below 200° C.

Figure 2C:
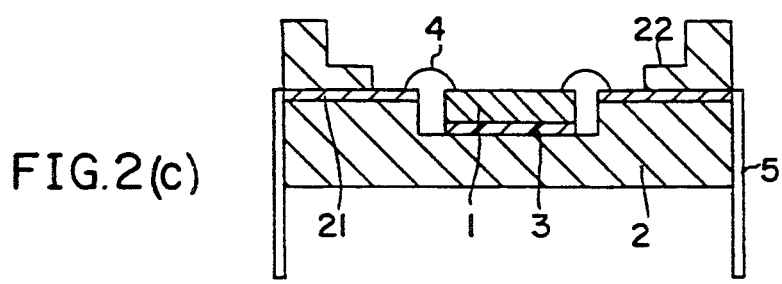

Next, as shown in FIG. 2(c), the pad of the solid-state imaging element 1 and the internal wiring 21 are connected by a metal wires 4 such as aluminum or gold, and the electrical signals from the solid-state imaging element 1 are transferred to the outside by the external leads 5 of the semiconductor package 2.

Figure 2D:
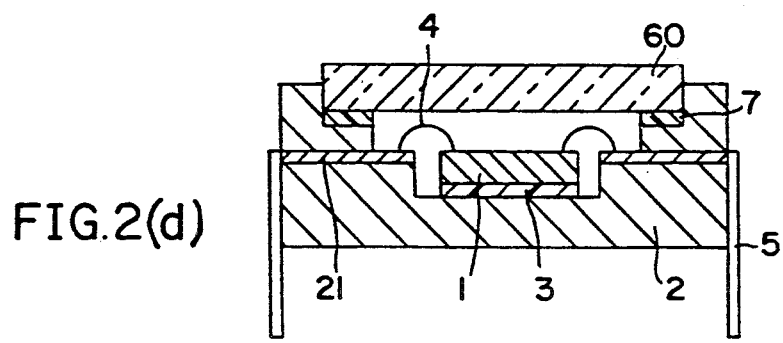

Thereafter, as shown in FIG. 2(d), in order to protect the solid-state imaging element 1 from the external atmosphere, such as a space environment or a nuclear reactor environment, the anti-radiation glass 60 including an anti-radiation substance such as cerium oxide or titanium oxide is fixed in the groove 22 in the semiconductor package 2 with a sealing resin 7 such as an epoxy resin which is hardened at a low temperature below 200° C., thereby completing a semiconductor package including a solid-state imaging element.

Here, as the anti-radiation glass 60, glass having a thickness that is reduced in order to enhance the light transmissivity at short wavelengths and in which defects such as stria or air bubbles below 5 microns is used.

Figure 3:
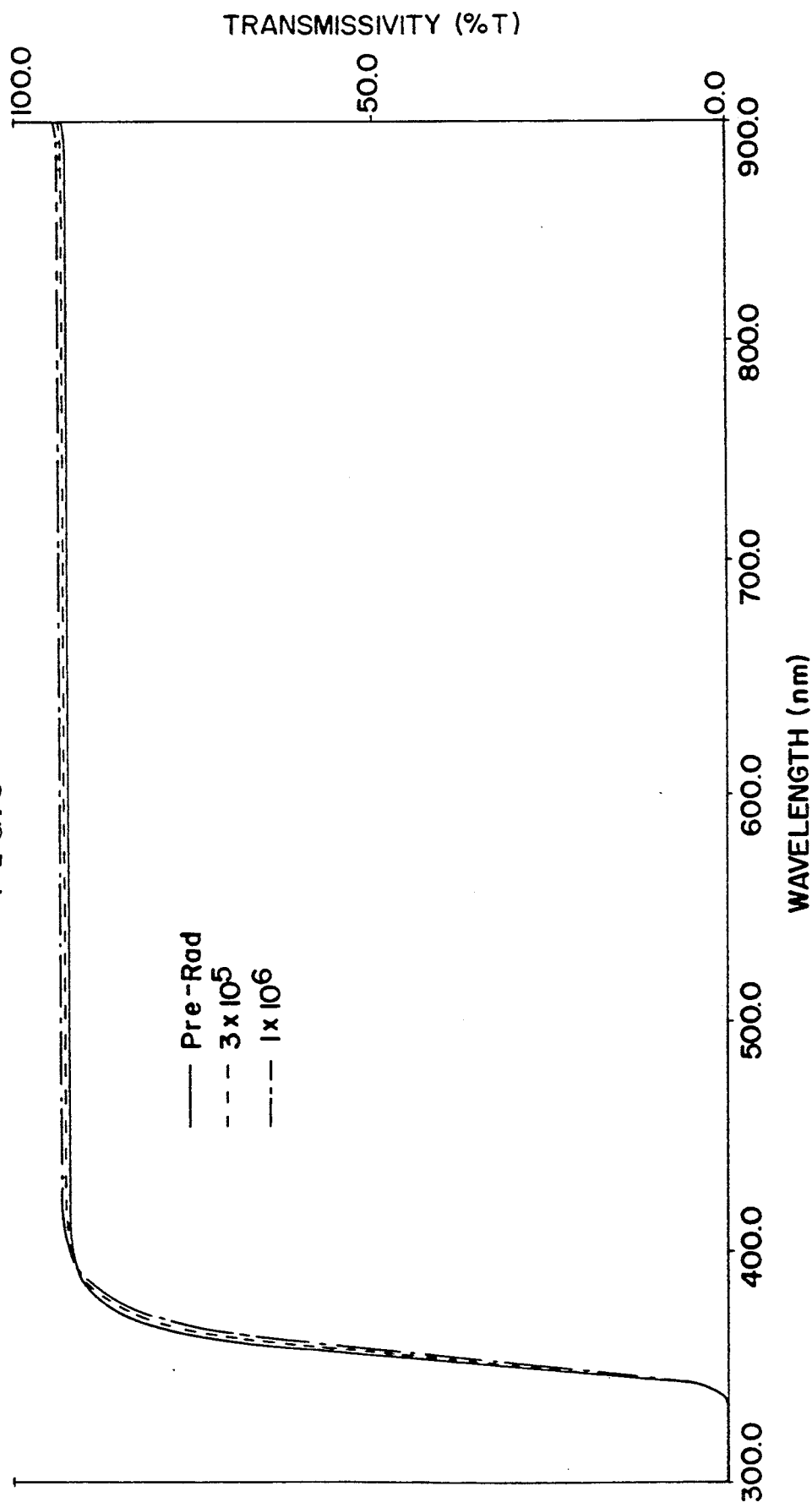
FIG. 3 is a diagram showing spectral characteristics of the anti-radiation glass such as cerium oxide or titanium oxide irradiated by gamma rays, which glass is employed in the present invention.

FIG. 3 shows optical spectral characteristics where gamma rays irradiated the anti-radiation glass. As shown in FIG. 3, in a case where the anti-radiation glass 60 is used, even after gamma rays of $3 \times 10^5$ rads or $1 \times 10^6$ rads irradiate the glass, the transmissivity does not change very much relative to pre-radiation and superior optical spectral characteristics is obtained.

Figure 4:
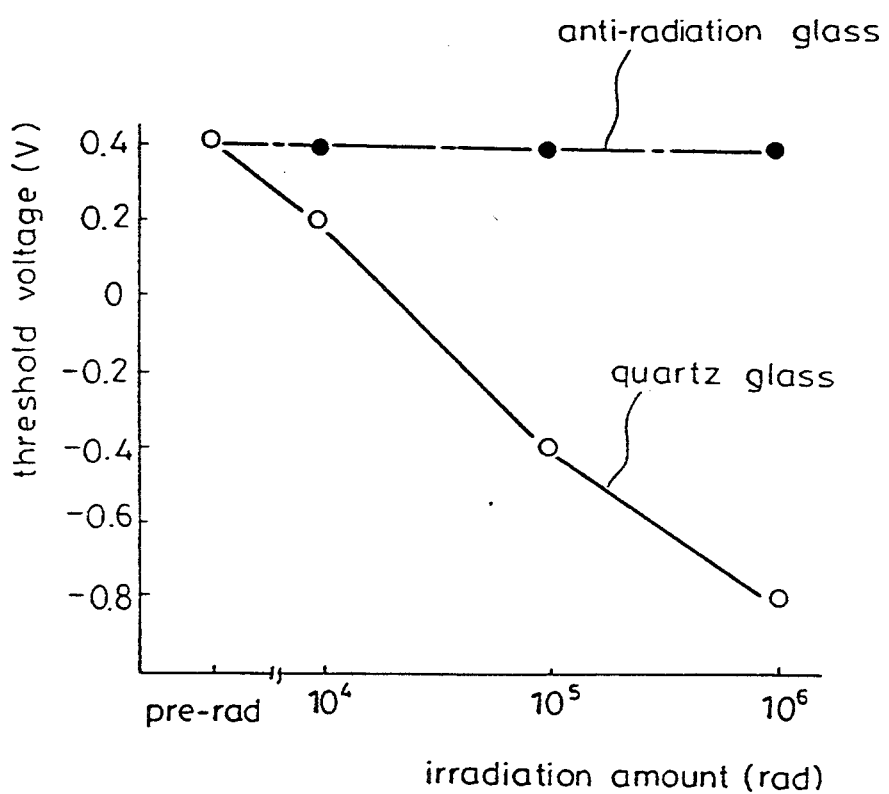
FIG. 4 is a diagram showing the change of threshold voltage of an n channel transistor before and after irradiation by gamma rays in a semiconductor package according to the present invention and the prior art.

Furthermore, FIG. 4 shows the change in the threshold value of a packaged transistor in a package using the non-alkali glass in the conventional device and the anti-radiation glass in the embodiment of the present invention. White circles are those of the conventional device and black circles are those of the embodiment of the present invention. As shown in the figure, it is seen that in using the anti-radiation glass 60 of the embodiment, the threshold value of the transistor of the solid-state imaging element does not vary very much between the pre-irradiation and after-radiation.

In the embodiment described above, the optical glass for protecting the solid-state imaging element 1 is made of anti-radiation glass including cerium oxide or titanium oxide and a high reliability device which has almost no lowering of glass transmissivity due to radiation in the space environment and nuclear reactor environment and no change in the threshold voltage of a transistor of a solid-state imaging element is obtained.

In addition, a groove is provided at an upper part of the semiconductor package 2, and the anti-radiation glass 60 is fixed in the groove by the sealing resin 7, thereby preventing positional deviation of the optical glass in the semiconductor package 2.

In the above-described embodiment, irradiation which intrudes from above the solid-state imaging element 1 is described. Irradiation which intrudes from the bottom surfaces or side surface of the solid-state imaging element 1 can be obstructed almost perfectly because the thickness of the semiconductor package itself 2 is large and the proportion of intrusion of the irradiation is less.

While in the above-illustrated embodiment the anti-radiation glass 60 comprising a material such as cerium oxide or titanium oxide is provided as protection glass, it is possible to provide anti-radiation glass 60 serving as a protection glass including a metal frame including a heavy metal which is a shield against radiation, at the periphery of the anti-radiation glass.

Figure 5:
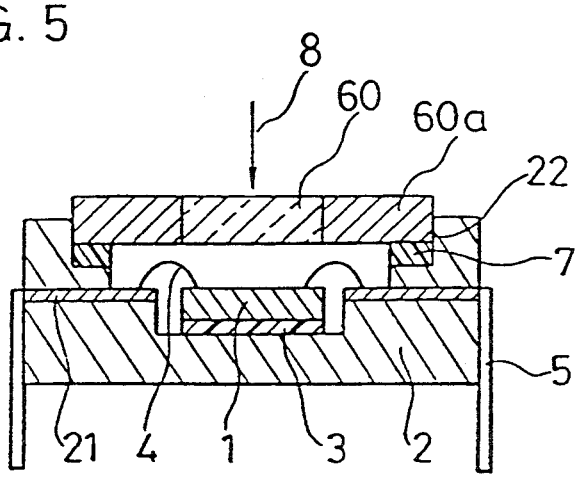
FIGS. 5 and 6 are cross-sectional views of semiconductor packages in accordance with second and third embodiments of the present invention.

FIG. 5 shows a second embodiment of the present invention. In FIG. 5, a metal frame 60a including a heavy metal such as Pb which is a radiation shield is provided at the periphery of the anti-radiation glass 60 and the anti-radiation glass 60 is arranged only above the solid-state imaging element 1. Such a structure can be obtained by firstly providing a metal frame 60a including a heavy metal at the periphery of the anti-radiation glass 60 and fixing the product to groove in the semiconductor package 2.

Since in this embodiment anti-radiation glass is used for protecting the solid-state imaging element 1 from the external environment similarly as in the above-described embodiment, it is possible to prevent deterioration of the element characteristics due to irradiation by gamma rays. Further since the protection glass is fixed to a groove part of the semiconductor package, defects in the airtightness due to positional deviation of the glass can be prevented.

Furthermore, since a frame 60a including heavy metal shield is provided at the periphery of the anti-radiation glass 60 which is other than the light receiving part of the solid-state imager, it is possible to lower the cost of the anti-radiation glass 60 and it is possible to shield the imager from the radiation which is incident to the element 1 diagonally and to prevent the scattering of light.

Figure 6:
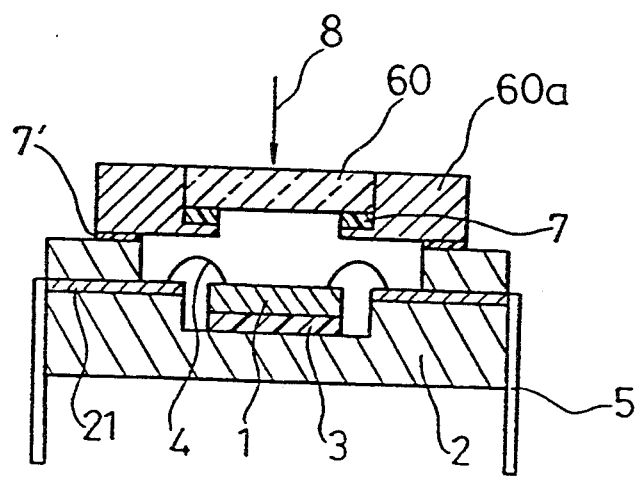

FIG. 6 shows a semiconductor package in accordance with a third embodiment of the present invention. A metal frame 60a including a heavy metal and having an aperture corresponding to the light receiving part of the solid-state imaging device 1 is fixed to the semiconductor package 2 with the sealing resin 7' and further the anti-radiation glass 60 is fixed to the metal frame 60a by the sealing resin 7.

This structure can be obtained by integrally producing the semiconductor package 2 and the metal frame 60a, by fixing the metal frame 60a including a heavy metal to the semiconductor package 2 with sealing resin 7', and fixing the anti-radiation glass 60 using sealing resin 7 having a lower melting point than the sealing resin 7'.

This embodiment has, in addition to the effects of the first and the second embodiments, an advantage in that the anti-radiation glass 8 can be easily removed from the metal film 60a.

FIGS. 7 and 8 show a fourth and a fifth embodiment of the present invention. In these figures, the same reference numerals designate the same parts as those shown in figures 1 and 5. Numeral 30 designates a titanium oxide film or cerium oxide film provided at the lower surface of the anti-radiation glass 60. These structures are both produced by depositing a film 30 comprising an anti-radiation material at the lower surface of the anti-radiation glass 30 of FIGS. 1 and 2 to a thickness of about 1 micron. In these embodiments, the radiation shielding ability of the optical glass of the first and the second embodiments can be further strengthened.

Figure 9:
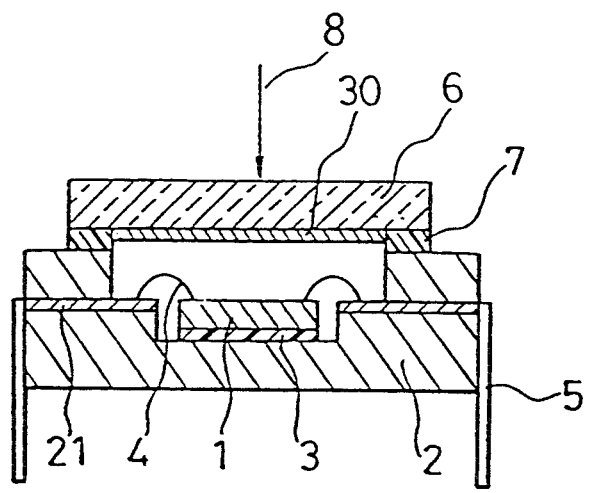
FIG. 9 is a cross-sectional view showing a semiconductor package in accordance with a sixth embodiment of the present invention.
Figure 10:
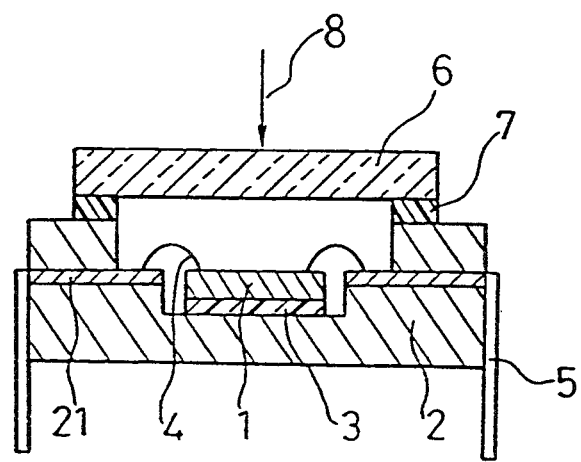
FIG. 10 is cross-sectional view showing a prior art semiconductor package.
Figure 11:
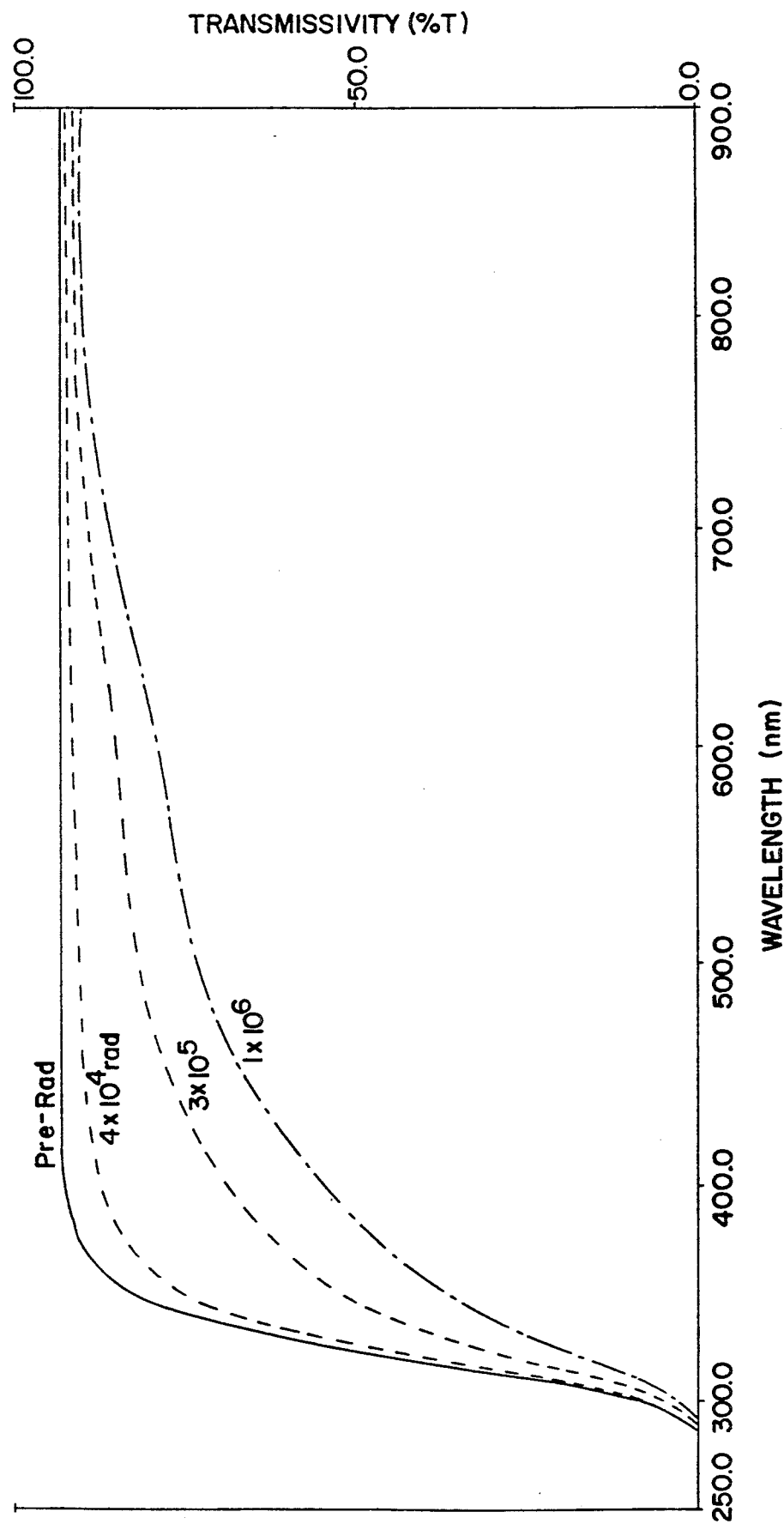
FIG. 11 is a diagram showing optical characteristics of optical glass irradiated by gamma rays, which glass is employed in the prior art semiconductor package.

FIG. 9 shows a sixth embodiment of the present invention. In this sixth embodiment, the optical glass of the semiconductor package is constituted by non-alkali glass and a thin film of anti-radiation material is provided at the lower surface of the non-alkali glass 6. This construction to prevents radiation such as gamma rays which pass through the optical glass from entering the inside of the semiconductor package 2.

In the above-illustrated embodiments, the configuration of the anti-radiation glass 60 is not limited, and a circular or a polygonal window can be adopted.

In the above-described embodiment a solid-state imager 1 is described, but any semiconductor element which requires that the light is incident on its surface can be employed as a semiconductor element in the present invention. For example, a solid-state sensor or EEPROM (electrically erasable and programmable ROM) can be employed.

As is evident from the foregoing description, protection glass for protecting a solid-state imaging element is constituted by anti-radiation glass including cerium oxide or titanium oxide, therefore it is possible to prevent a reduction in the transmissivity of the glass due to irradiation in the space environment or nuclear reactor environment and a change in the threshold voltage of a transistor of a solid-state imaging element, thereby resulting in a high reliability solid-state imager.

In addition, a metal frame including a heavy metal is provided at the periphery of the anti-radiation glass and the radiation which is diagonally incident on the semiconductor package is blocked by the metal frame, therefore the lowering of transmissivity of the glass due to irradiation of radiation and the change in the threshold voltage of the transistor of the solid-state imager is prevented. The light which is incident diagonally on the light receiving surface of the solid-state imager can be reduced and the scattering of light in the semiconductor package can be suppressed.

In addition, a groove is provided for fixing the optical glass, in an upper part of the semiconductor package, and the above described anti-radiation glass or a metal frame including a heavy metal fixed to the periphery of the anti-radiation glass is soldered to the semiconductor package. Therefore, positional alignment of the anti-radiation glass relative to the center of the solid-state imaging element can be performed easily and precisely.

What is claimed is:

1. A packaged semiconductor device comprising:
   a semiconductor element including a surface on which light is incident;
   a semiconductor package containing said semiconductor element and including at least one external lead for transferring an electrical signal from said semiconductor element to the outside; and
   optical glass sealing said semiconductor package and protecting said semiconductor element for transmitting light to said semiconductor element wherein said optical glass includes at least one of cerium oxide and titanium oxide for absorbing high energy radiation.

2. The packaged semiconductor device as defined in claim 1 wherein said semiconductor package includes a groove and said optical glass is disposed in the groove, sealing said semiconductor package.

3. The packaged semiconductor device as defined in claim 2 wherein said optical glass is sealed to said semiconductor package with a low melting temperature solder.

4. The packaged semiconductor device as defined in claim 1 including a peripheral metal frame holding said optical glass, said metal frame including a heavy metal for shielding said semiconductor element from high energy radiation.

5. The packaged semiconductor device as defined in claim 4 wherein said semiconductor package includes a groove and said metal frame is disposed in the groove, sealing said semiconductor package.

6. The packaged semiconductor device as defined in claim 4 wherein said metal frame is sealed to said semiconductor package with a low melting temperature solder.

7. A packaged semiconductor device comprising:
   a semiconductor element including a surface on which light is incident;

a semiconductor package containing said semiconductor element and including at least one external lead for transferring an electrical signal from said semiconductor element to the outside; and optical glass sealing said semiconductor package and protecting said semiconductor element and for transmitting light to said semiconductor element including a film disposed on said optical glass, said film including at least one of cerium oxide and titanium oxide for absorbing high energy radiation.

8. A semiconductor package as defined in claim 7 wherein said optical glass comprises non-alkali glass.

* * * * *